US012672507B2

(12) United States Patent　　　　　(10) Patent No.:　US 12,672,507 B2
Gwo et al.　　　　　　　　　　　　　　(45) Date of Patent:　Jun. 30, 2026

(54) HEATING APPARATUS AND PRETREATMENT METHOD FOR WAFER

(71) Applicant: HERMES-EPITEK CORPORATION, Taipei City (TW)

(72) Inventors: Shang-Jr Gwo, New Taipei City (TW); Ching-Wen Chang, Kaohsiung City (TW)

(73) Assignee: Hermes-Epitek Corporation, Taipei City (TW)

( * ) Notice: Subject to any disclaimer, the term of this patent is extended or adjusted under 35 U.S.C. 154(b) by 456 days.

(21) Appl. No.: 18/389,445

(22) Filed: Nov. 14, 2023

(65) Prior Publication Data

US 2025/0157835 A1　　May 15, 2025

(51) Int. Cl.
　*H01L 21/67*　　　(2006.01)
　*H01L 21/687*　　(2006.01)
　*H10P 14/20*　　　(2026.01)
　*H10P 72/00*　　　(2026.01)
　*H10P 72/76*　　　(2026.01)

(52) U.S. Cl.
　CPC .......... *H10P 72/0436* (2026.01); *H10P 14/36* (2026.01); *H10P 72/7624* (2026.01)

(58) Field of Classification Search
　None
　See application file for complete search history.

(56) References Cited

U.S. PATENT DOCUMENTS

| | | | | |
|---|---|---|---|---|
| 6,825,447 | B2 * | 11/2004 | Kim | H10P 72/0434 |
| | | | | 118/724 |
| 2003/0049372 | A1 * | 3/2003 | Cook | C23C 16/4412 |
| | | | | 118/724 |
| 2022/0210873 | A1 * | 6/2022 | Ptasienski | H05B 3/06 |

FOREIGN PATENT DOCUMENTS

| | | | | |
|---|---|---|---|---|
| CN | 105826226 A | * | 8/2016 | H10P 72/7612 |
| JP | 2003524885 A | * | 8/2003 | H01L 21/67103 |
| WO | WO-2022101881 A1 | * | 5/2022 | B01J 19/006 |

* cited by examiner

*Primary Examiner* — Lawrence C Tynes, Jr.

(74) *Attorney, Agent, or Firm* — Donald E. Stout; Stout, Uxa & Buyan, LLP

(57) ABSTRACT

A heating apparatus includes a placement surface to place a wafer and a heating unit composed of resistance-heating elements, a first conductive component, and a second conductive component. The resistance heating elements are vertically stacked and spaced apart from each other, with each being parallel to the placement surface. In addition, the resistance heating elements are connected in parallel through the first and the second conductive components. A pretreatment method includes the steps of heating a wafer with the heating apparatus in a vacuumed chamber, and feeding a reactant gas into the chamber so that the reactant gas reacts with the surface of the wafer.

16 Claims, 8 Drawing Sheets

13

131        132

HEATING APPARATUS AND PRETREATMENT METHOD FOR WAFER

BACKGROUND OF THE INVENTION

1. Field of the Invention

The present invention relates to a heating apparatus and a wafer pretreatment method using the heating apparatus.

2. Description of Related Art

In the fabrication of semiconductors, it is often necessary to heat a wafer. For example, the surface of wafer, such as silicon carbide substrate, needs to be pretreated with hydrogen before epitaxy. The pretreatment needs to be done at a temperature and generally carried out under high vacuum in order to avoid impurity contamination. The manner to heat the wafer is therefore limited and only high-temperature thermal radiation can be used.

A hot filament made of a metal with high melting point is generally employed as a medium to generate thermal radiation. For example, Taiwan patent Publication No. TW200618680 discloses a resistive radiation heater composed of a filament that is manufactured by electrical discharge machining and features better uniformity and reliability.

However, resistive radiation heaters of this type typically heat the wafer up to about 600° C. The wafer cannot be heated above 800° C. even shorten the distance between it and the heater. On the other hand, the heater by direct heating conduction can heat the wafer above 1000° C.; however, the wafer is heated unevenly and is liable to break due to thermal stress.

SUMMARY OF THE INVENTION

The present invention relates to a heating apparatus and a pretreatment method using the heating apparatus.

In some embodiments, the heating apparatus includes a placement surface to place a wafer and a heating unit composed of resistance heating elements, a first conductive component, and a second conductive component. The resistance heating elements are vertically stacked and spaced apart from each other, with each being parallel to the placement surface and including a first end and a second end. The resistance heating elements are connected in parallel by connecting the first ends of the resistance heating elements with the first conductive component and connecting the second ends of the resistance heating elements with the second conductive component.

In some embodiments, the first conductive component is composed of a plurality of stacked first conductive blocks, and the second conductive component is composed of a plurality of stacked second conductive blocks.

In some embodiments, the heating apparatus further includes a mechanism to release the thermal stress generated during the heating process.

In some embodiments, there are plural of heating units in the heating apparatus.

In some embodiments, a pretreatment method includes the steps of heating a wafer with the above-mentioned heating apparatus in a vacuumed chamber; and feeding a reactant gas into the chamber so that the reactant gas reacts with the surface of the wafer.

In some embodiments, the wafer is silicon carbide.

The heating apparatus provided by this invention can uniformly heat the wafer up to 1400° C. or higher. The wafer pre-treated by the provided pretreatment method reveals a flat surface with atomic steps.

DETAILED DESCRIPTION OF THE PREFERRED EMBODIMENT

Reference will now be made in detail to those specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations and components are not described in detail in order not to unnecessarily obscure the present invention. While drawings are illustrated in detail, it is appreciated that the quantity of the disclosed components may be greater or less than that disclosed, except where expressly restricting the amount of the components. Wherever possible, the same or similar reference numbers are used in drawings and the description to refer to the same or like parts.

Figure 1:
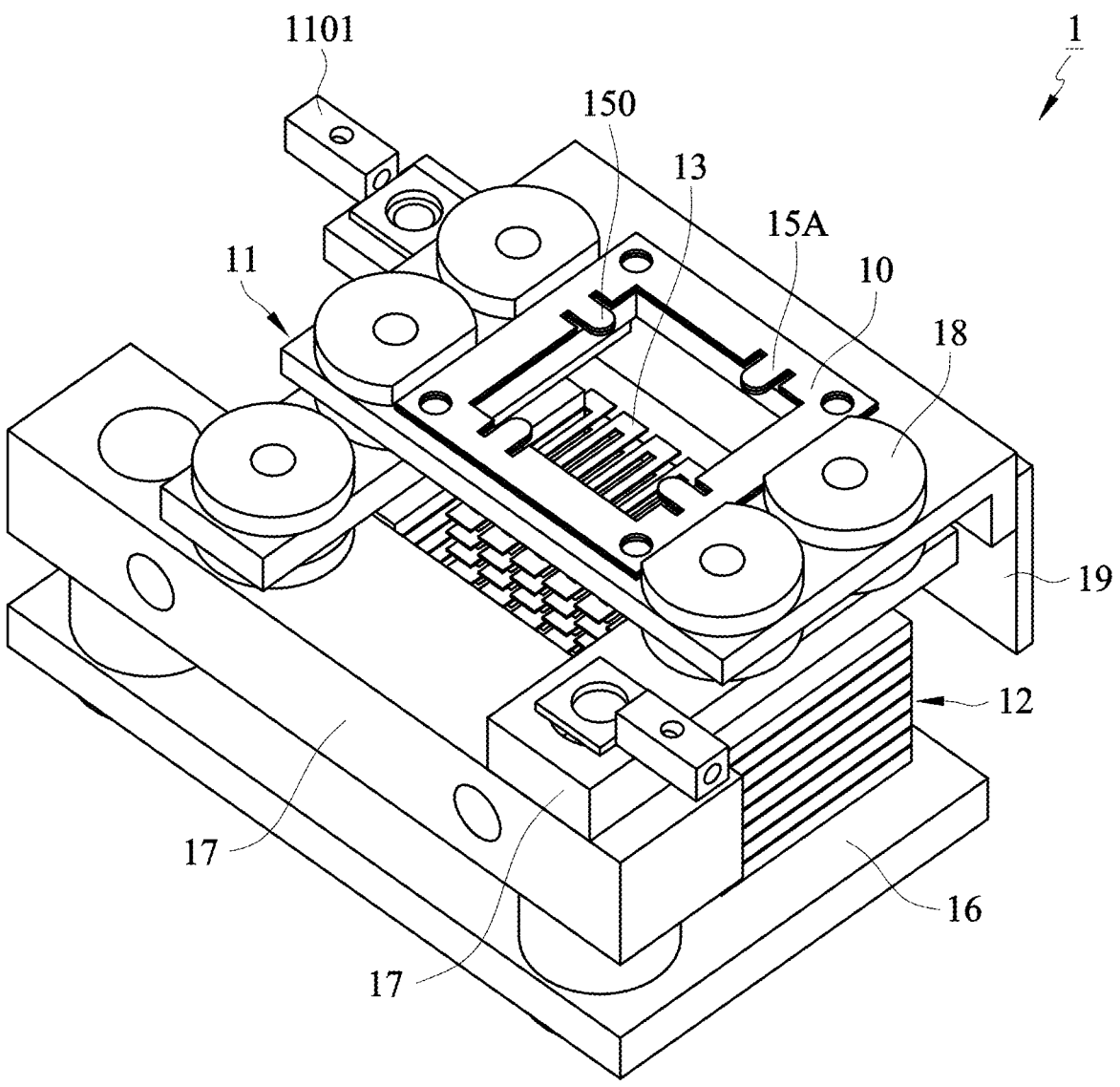
FIG. 1 shows a heating apparatus in accordance with an embodiment of the present invention.
Figure 2:
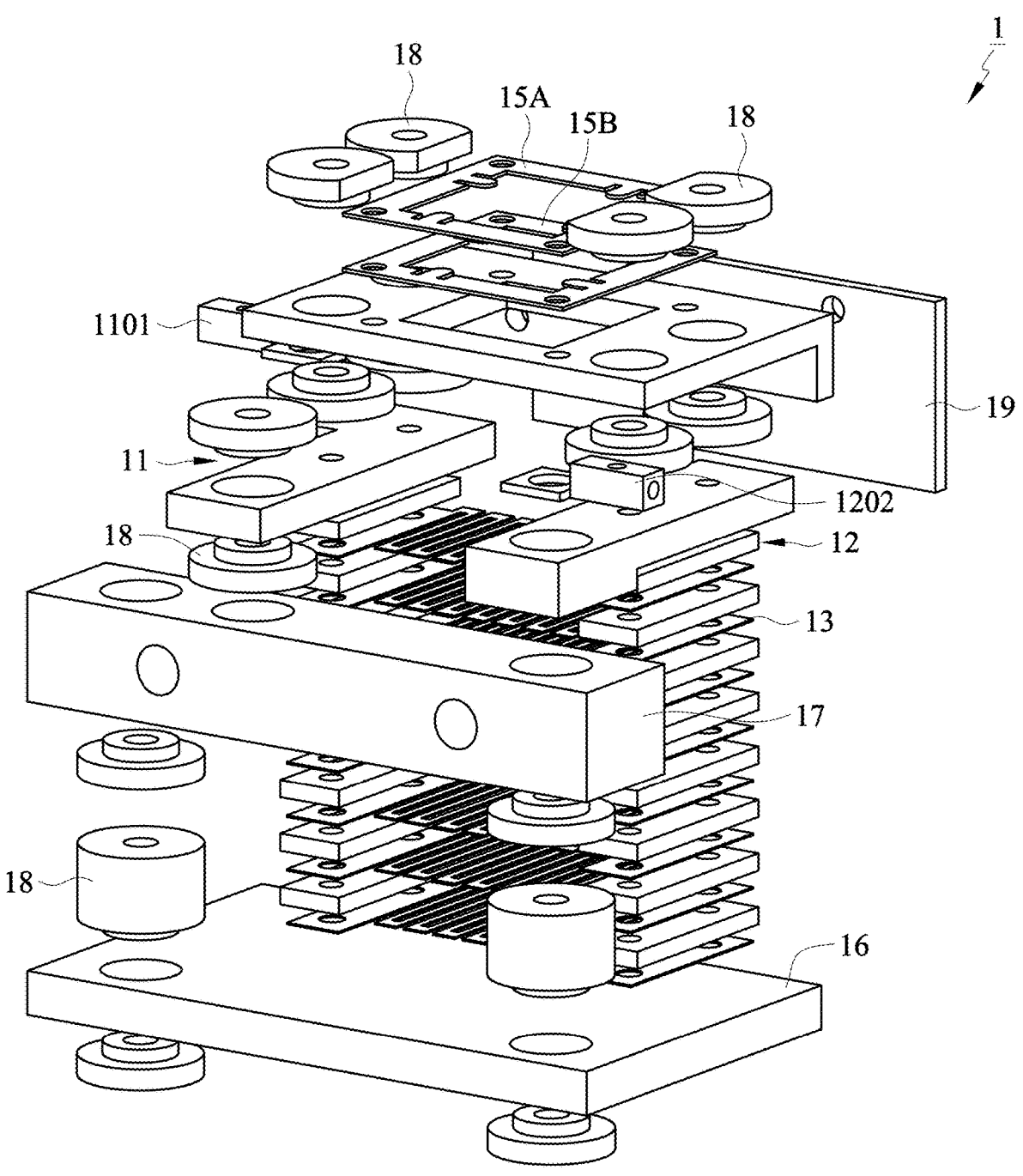
FIG. 2 is an exploded view of the heating apparatus shown in FIG. 1.
Figure 3:
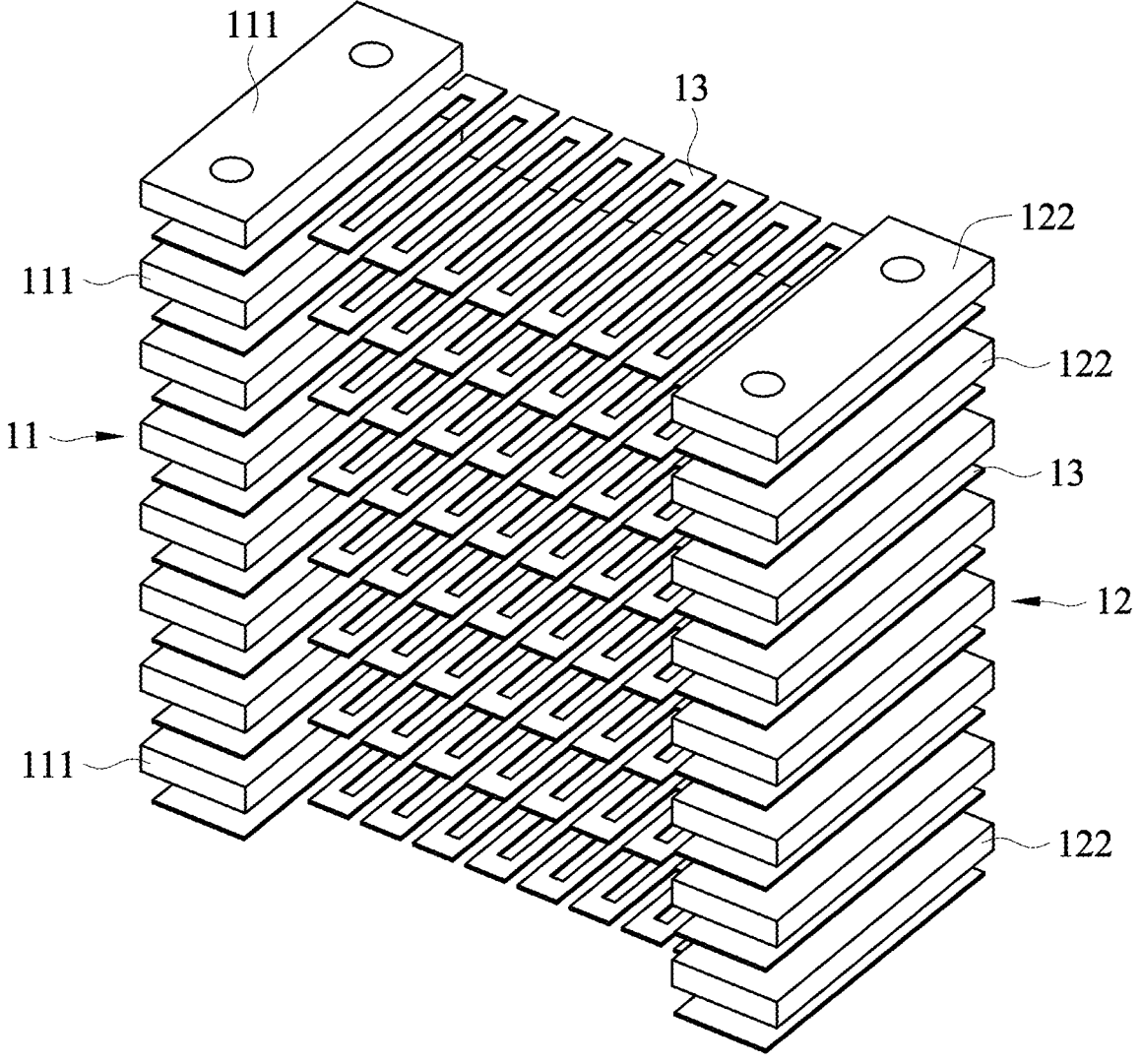
FIG. 3 is a perspective view showing a heating unit of the heating apparatus of FIG. 1.

FIG. 1 is a perspective view showing a heating apparatus 1 in accordance with an embodiment of the present invention. FIG. 2 is an exploded view of the heating apparatus 1. FIG. 3 is a perspective view showing a heating unit of the heating apparatus 1. Referring to FIGS. 1-3, the heating apparatus 1 mainly includes a placement surface 10 and a heating unit composed of a first conductive component 11, a second conductive component 12, and a plurality of resistance heating elements 13. A wafer to be heated, which could be any kind, is placed on the placement surface 10. The resistance heating elements 13 are vertically stacked and spaced apart from each other, with each being parallel to the replacement surface. The resistance heating elements 13 are electrically connected in parallel through the first conductive component 11 and the second conductive component 12. In the exemplary embodiment, the first conductive component 11 and the second conductive component 11 are respectively connected to a first (e.g., positive) electrode and a second (e.g., negative) electrode of a power source. In another embodiment, the first conductive component 11 and the second conductive component 11 are connected to respective different power supplies. The resistance heating elements 13 are arranged on respective planes parallel to the placement surface 10. The power supply can be DC or AC power supply.

FIG. 3 depicts a heating unit according to an embodiment of the present invention. Referring to FIG. 3, in the exemplary embodiment, the first conductive component 11 includes stacked first conductive blocks 111, and the second conductive component 12 includes stacked second conductive blocks 122. In the exemplary embodiment, except for the lowest first conductive block 111, each first conductive block 111 is stacked on top of the below adjacent first conductive block 111. Likewise, except for the lowest second conductive block 122, each second conductive block 122 is stacked on the below adjacent second conductive block 122. Referring to FIGS. 1 and 2, the first conductive component 11 and the second conductive component 12 may connect to one or individual power sources through the first connecting terminal 1101 and the second connecting terminal 1202. In the exemplary embodiment, the first connecting terminal 1101 connects to the uppermost first conductive block 111, and the connecting second terminal 1202 connects to the uppermost second conductive block 122. The arrangement is not limited to the structures described above, and other arrangements may also be used.

Figure 4:
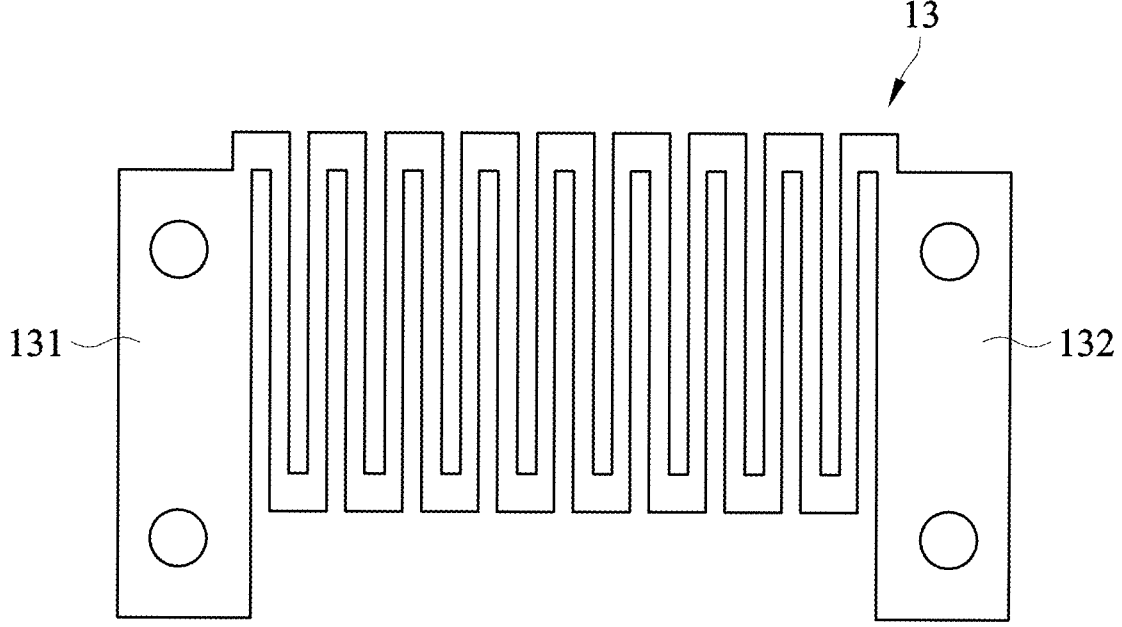
FIG. 4 is a top view showing one resistance heating element in accordance with an embodiment of the present invention.

FIG. 4 is a top view showing a single resistance heating element 13 according to an embodiment of the present invention. Referring to FIGS. 3 and 4, each resistance heating element 13 includes a first end 131 and a second end 132. The first conductive component 11 connects to the first end 131 of each resistance heating elements 13, and the second conductive component 11 connects to the second end 132 of each resistance heating element 13. In this way, the power supply and all the resistance heating elements 13 form a parallel circuit. The resistance heating element 13 may be manufactured by electrical discharge machining and can be arranged in, but not limited to, a backward and forward parallel pattern.

Referring to FIGS. 2 and 3, in the exemplary embodiment, the first end 131 of each resistance heating element 13 is sandwiched by two first conductive blocks 111, and the second end 132 of each resistance heating element 13 is sandwiched by two second conductive blocks 122.

In one embodiment, each resistance heating element 13 corresponds to one first conductive block 111 and one second conductive block 122. Each first conductive block 111 includes a first slit (not shown), and each second conductive block 122 includes a second slit (not shown). The first end 131 of each resistance heating element 13 is inserted into the first slit of the corresponded first conductive block 111, and the second end 132 of each resistance heating element 13 is inserted into the second slit of the corresponded second conductive block 122.

In one embodiment, the first conductive component 11 and the second conductive component 12 are respectively an integral structure and respectively includes a plurality of first slits (not shown) and a plurality of second slits (not shown). The first end 131 and the second end 132 of each resistance heating element 13 are respectively inserted into a corresponding first slit and a corresponding second slit.

Referring to FIG. 1 to FIG. 3, the resistance heating element 13 is made of a metal with a high melting point, and preferably, no outgassing will occur under high vacuum. In some embodiments, the resistance heating element 13 is made of tungsten (W), molybdenum (Mo), tantalum (Ta), rhenium (Re), or combinations thereof. In some embodiments, in order to improve the uniformity of thermal radiation, the resistance heating element 13 is divided into multiple regions, such as a central region and a peripheral region, and different regions are made of different materials.

In some embodiments, the first conductive component 11 and the second conductive component 12 may be made of molybdenum (Mo), tantalum (Ta), rhenium (Re), or combinations thereof.

Referring to FIGS. 1 and 2, an upper clamping frame 15A and a lower clamping frame 15B may be provided on the placement surface 10 in order to prevent the wafer from cracking during thermal radiation. The wafer to be heated will be placed between the upper clamping frame 15A and the lower clamping frame 15B. The upper clamping frame 15A and the lower clamping frame 15B are preferably elastic sheets and respectively include protrusions 150, which may be lifted to release the thermal stress generated during the heating process. The upper clamping frame 15A and the lower clamping frame 15B may be not rectangle-shaped and their shape may vary with the wafer.

Referring to FIGS. 1 and 2, the heating apparatus 1 may include a base 16 for placing the heating unit. The heating apparatus 1 may include supporting blocks 17 to support and connect components including the first conductive component 11, the second conductive component 12, and the placement surface 10. Shields 19 may be provided around and above the heating apparatus 1 to prevent the leaking of thermal radiation. In order to show the details of the heating apparatus 1, FIG. 1 only shows the shield 19 behind the heating apparatus 1. Each of the mentioned components may include threaded holes, so that the components can be connected by using fixing components 18 such as screws. In some embodiments, riveting and/or welding can also be used to fix the components. Both the supporting block 17 and the fixing element 18 are preferably made of materials with high melting temperatures and without outgassing under high vacuum. In the exemplary embodiment, the supporting blocks 17 are made of molybdenum, and the fixing elements 18 are made of ceramics.

In the embodiment described in FIGS. 1-4, the heating unit is arranged in rectangular shape, but it can also be arranged in other shapes, such as polygonal or circular.

Figure 5:
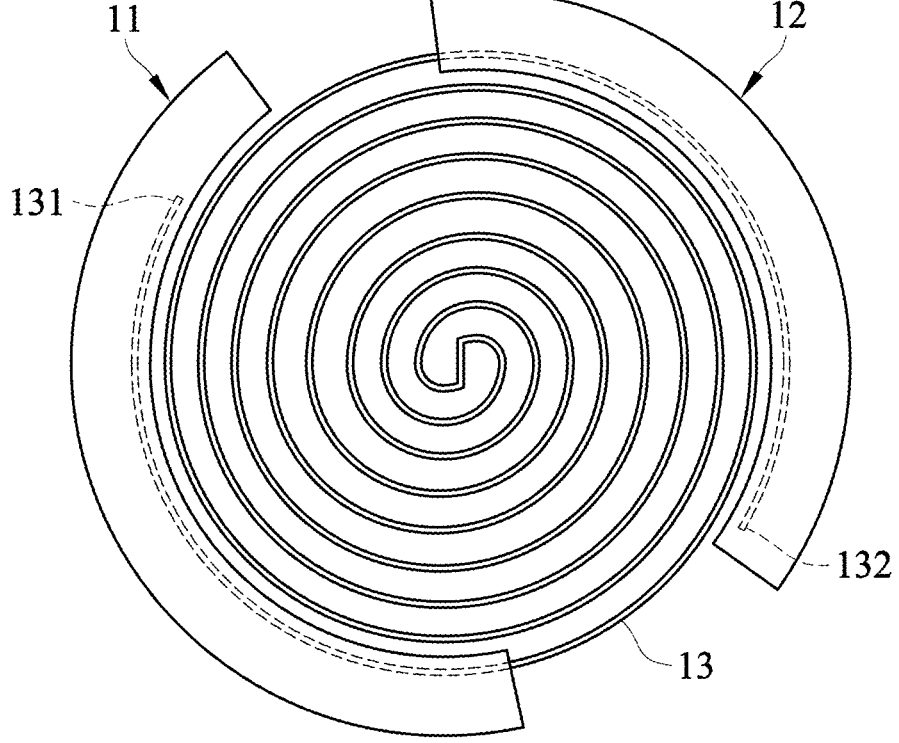
FIG. 5 is a schematic top view showing a heating unit of the heating apparatus in accordance with another embodiment of the present invention.
Figure 6:
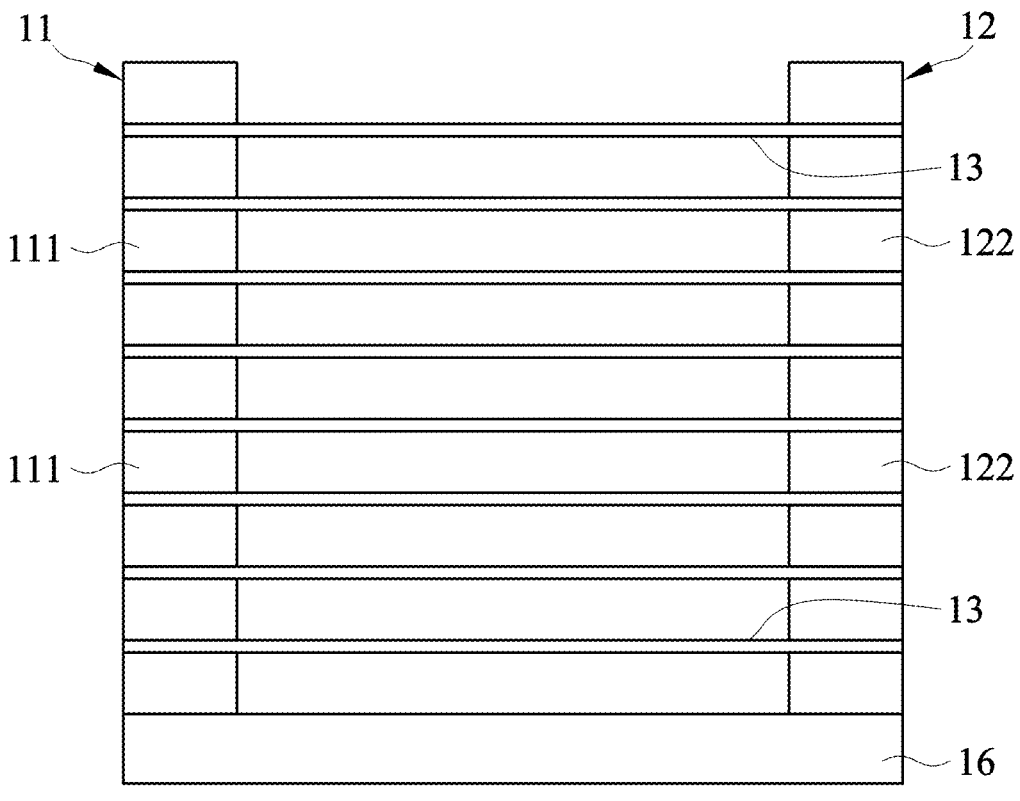
FIG. 6 is a schematic side view of the heating unit shown in FIG. 5.

FIGS. 5 and 6 are respectively schematic top and side views showing a heating unit of the heating apparatus 1 according to another embodiment of the present invention. The resistance heating element 13 is circular as shown in FIG. 5. Similarly, the first conductive component 11 connects to the first ends 131 of all resistance heating elements 13, and the second conductive component 11 connects to the second ends 132 of all resistance heating elements 13. Other details of this embodiment can be the same as the heating apparatus described in FIGS. 1-4.

Figure 7:
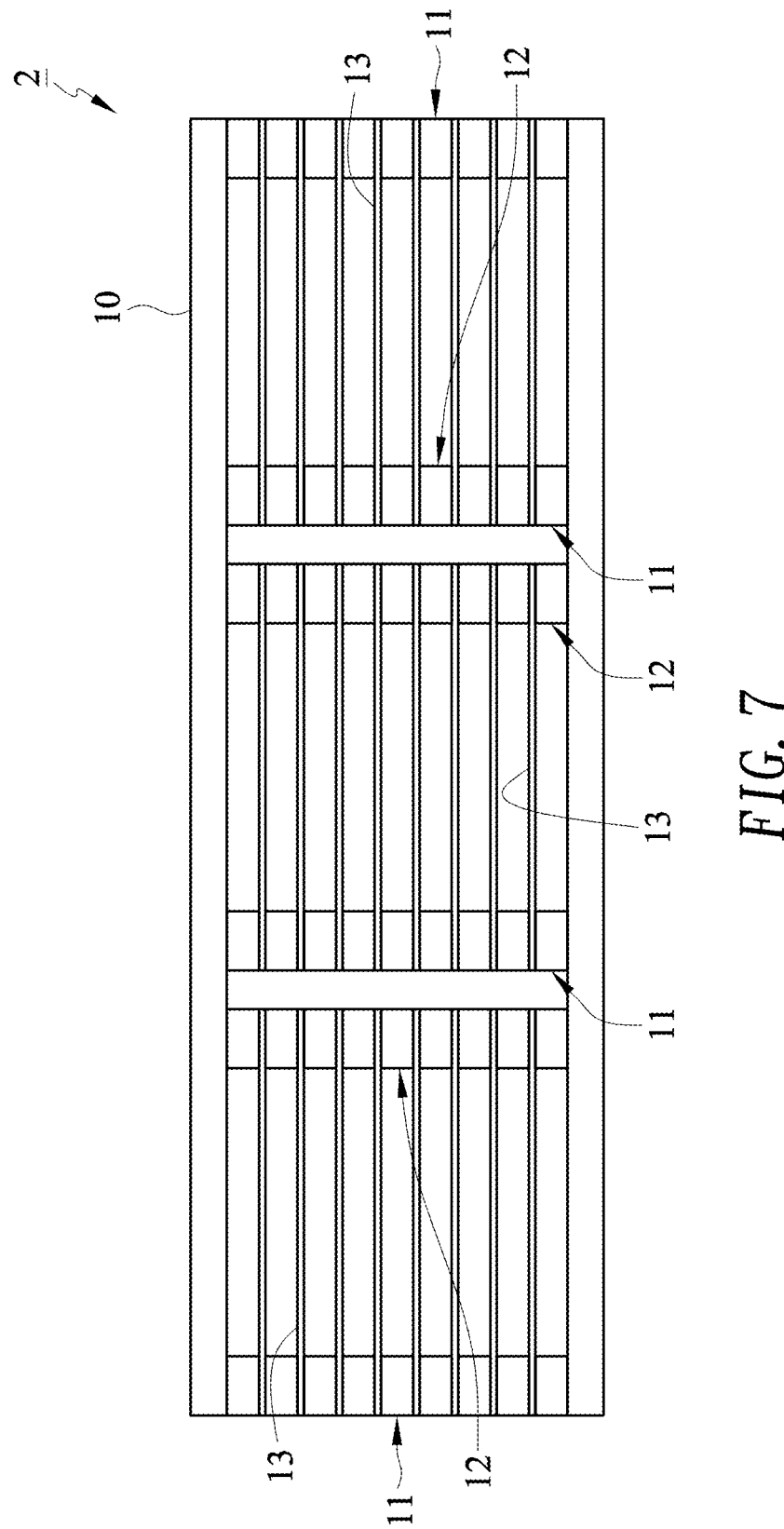
FIG. 7 is a schematic side view showing a heating apparatus in accordance with another embodiment of the present invention.

The heating apparatus 1 as described above can be scale up for heating a larger wafer. It can handle wafer with a diameter of 4", 6", 8" or larger. In the foregoing embodiments, the heating apparatus contain a single heating unit. FIG. 7 is a schematic side view showing a heating apparatus 2 according to another embodiment of the present invention. The heating apparatus 2 features multiple heating units to heat a wafer. In addition, the first conductive components 11 of the heating units are connected to the same or individual power sources, and the second conductive components 12 of the heating units are connected to the same or individual power sources.

Figures 8, 9A, 9B:
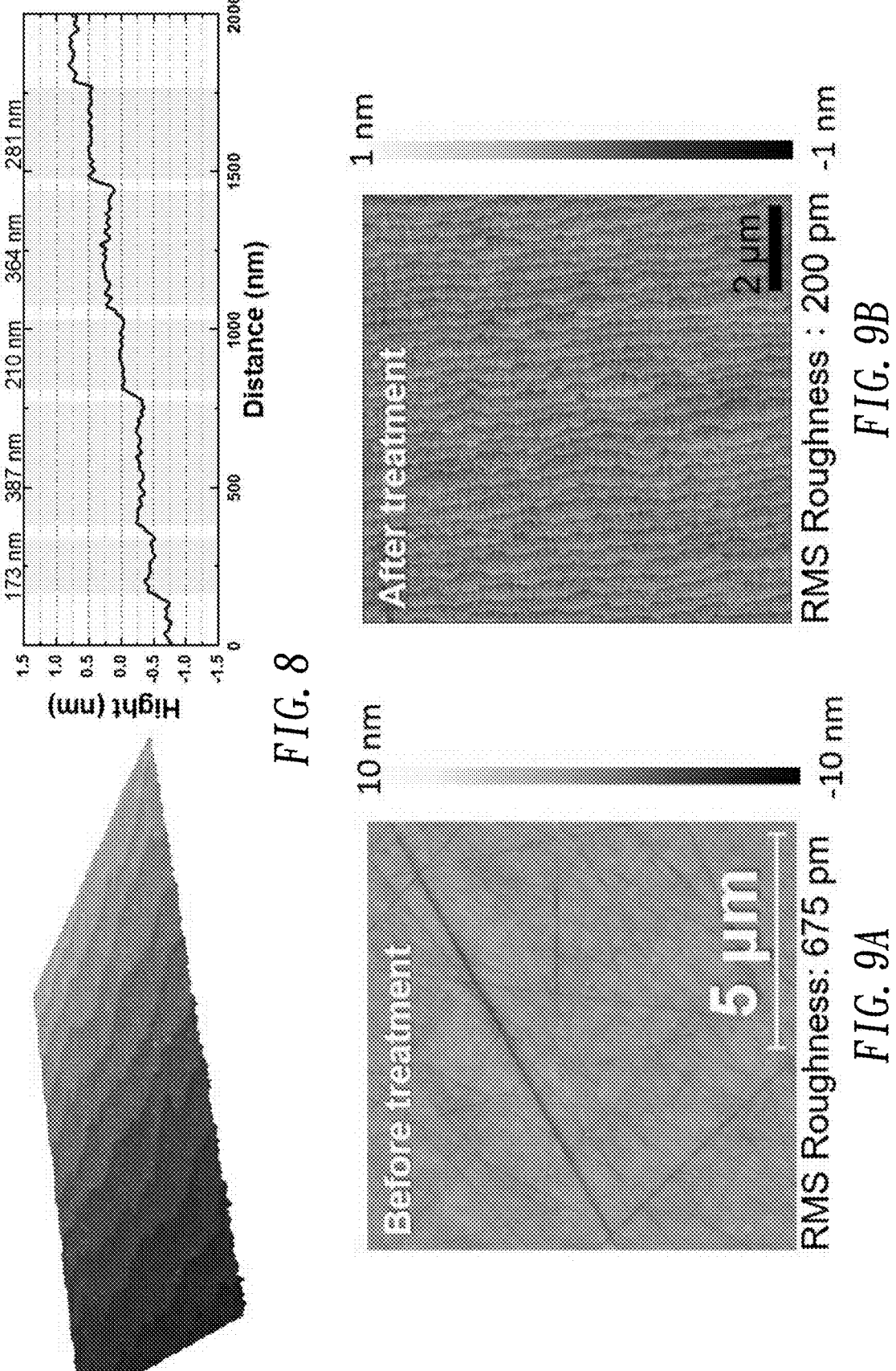
FIG. 8 shows the surface morphology of a wafer after pretreatment by the heating apparatus of the present invention.
FIG. 9A and FIG. 9B are micrographs of the wafer before and after pretreatment, respectively.

FIG. 8 shows the surface morphology of a silicon carbide wafer after pretreatment by the provided heating apparatus 1. FIGS. 9A and 9B are atomic force microscopy images of the silicon carbide wafer before and after pretreatment, respectively. After cut and polished by e.g., chemical-mechanical planarization (CMP), the surface of the silicon carbide wafer is roughly stepped in the microscopic view. The silicon carbide wafer is placed on the placement surface 10 of the heating apparatus 1, which is then placed in a chamber with pressure down to 60 torr. The silicon carbide wafer is heated to 1400° C. by the heating apparatus, and the chamber is fed with hydrogen and argon at a volume ratio of 1:10 to make hydrogen react with silicon carbide. This procedure lasts for 10 to 30 minutes. As shown in FIG. 7, after 30 minutes of pretreatment, the surface of the silicon carbide wafer reaches atomic flatness. As shown in FIG. 9A and FIG. 9B, the root mean square roughness (RMS roughness) of the silicon carbide wafer surface before the pretreatment is 675 μm, and the wafer surface becomes atom-stepped with RMS roughness 200 pm after the pretreatment. An atom-stepped surface is a surface composed of atomic steps. Therefore, the surface of the silicon carbide wafer is epi-ready that can be used without further treatment.

The intent accompanying this disclosure is to have each/all embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention.

Conditional language, such as, among others, "can," "could," "might," or "may," unless specifically stated otherwise, or otherwise understood within the context as used, is generally intended to convey that embodiments include, and in other interpretations do not include, certain features, elements and/or steps. Thus, such conditional language is not generally intended to imply that features, elements and/or steps are in any way required for one or more embodiments, or interpretations thereof, or that one or more embodiments necessarily include logic for deciding, with or without user input or prompting, whether these features, elements and/or steps are included or are to be performed in any particular embodiment.

Although specific embodiments have been illustrated and described, it will be appreciated by those skilled in the art that various modifications may be made without departing from the scope of the present invention, which is intended to be limited solely by the appended claims.

All publications, patents and patent applications mentioned in this specification are herein incorporated in their entirety by reference into the specification. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A heating apparatus, comprising:
a placement surface for placing a wafer; and
a heating unit comprising:

a plurality of resistance heating elements stacked vertically and spaced apart from each other, with each being parallel to the placement surface and including a first end and a second end;
a first conductive component connected to the first ends of the plurality of resistance heating elements; and
a second conductive component connected to the second ends of the plurality of resistance heating elements.

2. The heating apparatus according to claim 1, wherein the first conductive component connects to a first electrode of a power supply, and the second conductive component connects to a second electrode of the power supply.

3. The heating apparatus according to claim 1, wherein the first conductive component comprises a plurality of stacked first conductive blocks, and the second conductive component comprises a plurality of stacked second conductive blocks.

4. The heating apparatus according to claim 3, wherein the first end of each resistance heating element is sandwiched by two of the plurality of stacked first conductive blocks, and the second end of each resistance heating element is sandwiched by two of the plurality of stacked second conductive blocks.

5. The heating apparatus according to claim 1, further comprising an upper clamping frame and a lower clamping frame, wherein the wafer is arranged between the upper clamping frame and the lower clamping frame, and both the upper clamping frame and the lower clamping frame comprise a plurality of protrusion to release thermal stress.

6. The heating apparatus according to claim 1, wherein the plurality of resistance heating elements are made of tungsten.

7. The heating apparatus according to claim 1, wherein the first conductive component and the second conductive component are made of molybdenum.

8. The heating apparatus according to claim 1, wherein the wafer is heated to a temperature above 1000° C.

9. The heating apparatus according to claim 1, wherein the heating apparatus comprises two or more of the heating units.

10. A pretreatment method, comprising:
heating a wafer with a heating apparatus in a vacuum chamber; and
feeding a reactant gas into the vacuum chamber, so that the reactant gas reacts with the surface of the wafer;
wherein the heating apparatus comprises:
a placement surface for placing the wafer; and
a heating unit comprising:
a plurality of resistance heating elements stacked vertically and spaced apart from each other, with each being parallel to the placement surface and including a first end and a second end;
a first conductive component connected to the first ends of the plurality of resistance heating elements; and
a second conductive component connected to the second ends of the plurality of resistance heating elements.

11. The pretreatment method according to claim 10, wherein the wafer is heated to 1000° C. or higher.

12. The pretreatment method according to claim 10, wherein the wafer is heated to a temperature above 1400° C.

13. The pretreatment method according to claim 10, wherein the wafer has an atom-stepped surface after the pretreatment.

14. The pretreatment method according to claim 10, wherein the heating apparatus comprises two or more of the heating units.

15. The pretreatment method according to claim 10, wherein the wafer comprises silicon carbide.

16. The pretreatment method according to claim 10, wherein the reactant gas comprises hydrogen.

\* \* \* \* \*